(12) United States Patent
Shu et al.

(10) Patent No.: US 11,424,122 B2
(45) Date of Patent: Aug. 23, 2022

(54) MASK PATTERN, SEMICONDUCTOR STRUCTURE AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventors: Qiang Shu, Shanghai (CN); Yingchun Zhang, Shanghai (CN); Liusha Qin, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 17/036,691

(22) Filed: Sep. 29, 2020

(65) Prior Publication Data
US 2021/0210343 A1 Jul. 8, 2021

(30) Foreign Application Priority Data
Jan. 6, 2020 (CN) .......................... 202010010444.9

(51) Int. Cl.
*H01L 21/027* (2006.01)
*G03F 1/70* (2012.01)
*H01L 21/311* (2006.01)
*H01L 21/033* (2006.01)

(52) U.S. Cl.
CPC ............ *H01L 21/0274* (2013.01); *G03F 1/70* (2013.01); *H01L 21/0337* (2013.01); *H01L 21/31144* (2013.01)

(58) Field of Classification Search
None
See application file for complete search history.

(56) References Cited

U.S. PATENT DOCUMENTS

2011/0256723 A1* 10/2011 Lee .................. H01L 27/11529
438/694

* cited by examiner

*Primary Examiner* — Roberts P Culbert
(74) *Attorney, Agent, or Firm* — Anova Law Group, PLLC (57) ABSTRACT

A mask pattern, a semiconductor structure and a method for forming the semiconductor structure are provided. The mask pattern includes a first mask pattern and a second mask pattern. The first mask pattern includes a plurality of first target patterns, and the plurality of first target patterns are arranged along a first direction. The second mask pattern includes a plurality of second target patterns, and the plurality of second target patterns are arranged along the first direction. When the first mask pattern overlaps the second mask pattern, one of the plurality of first target patterns partially overlaps a corresponding one of the plurality of second target patterns.

10 Claims, 4 Drawing Sheets

MASK PATTERN, SEMICONDUCTOR STRUCTURE AND FABRICATION METHOD THEREOF

CROSS-REFERENCE TO RELATED APPLICATIONS

This application claims the priority of Chinese patent application No. 202010010444.9, filed on Jan. 6, 2020, the entirety of which is incorporated herein by reference.

FIELD OF THE DISCLOSURE

The present disclosure generally relates to the field of semiconductor manufacturing technology and, more particularly, relates to a mask pattern, a semiconductor structure and a fabrication method thereof.

BACKGROUND

With the development of very large-scale integrated circuits, device design dimensions are getting smaller and smaller, and changes in device critical dimensions (CD) have more and more influence on device performance. For example, change in critical dimensions of a gate structure directly leads to changes in device operating speed.

Photolithography is vital technology in semiconductor manufacturing technology. Photolithography can achieve the transfer of a pattern from a mask to a surface of silicon wafer, to form a semiconductor product that meets the design requirements. The photolithography process includes an exposure step, a development step performed after performing the exposure step, and an etching step performed after performing the development step.

In the exposure step, light is irradiated onto the silicon wafer coated with photoresist through a light-transmitting region in the mask, and the photoresist undergoes chemical reactions under the irradiation of the light. In the development step, because the irradiated and non-irradiated photoresist has different dissolution degree in the developer, a photolithography pattern is formed to transfer the mask pattern to the photoresist layer. In the etching step, based on the photolithography pattern formed in the photoresist layer, the silicon wafer is etched to further transfer the mask pattern to the silicon wafer.

Usually, a single exposure process and a single etching process can meet the requirements of forming a device with a substantially large critical dimension. When the critical dimension is substantially small, a self-aligned multiple patterning technology needs to be configured to meet the device size requirements.

However, in a case where both large and small critical dimensions need to be formed at the same time, when designing the mask pattern, the pattern density is not enough to meet the requirements of forming the device with a substantially small critical dimension. The disclosed methods and device structures are directed to solve one or more problems set forth above and other problems.

BRIEF SUMMARY OF THE DISCLOSURE

One aspect of the present disclosure includes a mask pattern. The mask pattern includes a first mask pattern and a second mask pattern. The first mask pattern includes a plurality of first target patterns, and the plurality of first target patterns are arranged along a first direction. The second mask pattern includes a plurality of second target patterns, and the plurality of second target patterns are arranged along the first direction. When the first mask pattern overlaps the second mask pattern, one of the plurality of first target patterns partially overlaps a corresponding one of the plurality of second target patterns.

Optionally, along the first direction, each first target pattern has a first size, and adjacent two first target patterns are separated by a first distance.

Optionally, along the first direction, each second target pattern has a second size, and adjacent two second target patterns are separated by a second distance.

Optionally, along the first direction, the second size is in a range of approximately 45 nm-60 nm, and the first size is in a range of approximately 25 nm-45 nm.

Optionally, along the first direction, the second size is in a range of approximately 100 nm-200 nm, and the first size is in a range of approximately 100 nm-200 nm.

Optionally, along the first direction, a ratio of a size of overlapped portion of the second target pattern with the first target pattern over the first size is in a range of approximately 40%-60%, and a ratio of a size of non-overlapped portion of the second target pattern with the first target pattern over the first distance is in a range of approximately 40%-60%.

Optionally, along the first direction, the size of the overlapped portion of the second target pattern with the first target pattern is approximately ½ of the first size, and the size of the non-overlapped portion of the second target pattern with the first target pattern is approximately ½ of the first distance.

Optionally, the first mask pattern further includes a plurality of first main target patterns, and the plurality of first main target patterns are arranged along the first direction.

Optionally, the second mask pattern further includes a plurality of second main target patterns, and the plurality of second main target patterns are arranged along the first direction.

Another aspect of the present disclosure includes a method for forming a semiconductor structure. The method includes providing a substrate; forming a sacrificial film on the substrate; and providing a mask pattern. The mask pattern includes a first mask pattern and a second mask pattern. The first mask pattern includes a plurality of first target patterns, and the plurality of first target patterns are arranged along a first direction. The second mask pattern includes a plurality of second target patterns, and the plurality of second target patterns are arranged along the first direction. When the first mask pattern overlaps the second mask pattern, one of the plurality of first target patterns partially overlaps a corresponding one of the plurality of second target patterns. The method also includes performing a first patterning process on the sacrificial film using the second mask pattern as a mask to form a plurality of discretely arranged sacrificial layers, where position and size of the plurality of sacrificial layers correspond to position and size of the plurality of second target patterns. In addition, the method includes forming a sidewall spacer on a sidewall surface of a sacrificial layer of the plurality of sacrificial layers; after forming the sidewall spacer, removing the plurality of sacrificial layers; and after removing the plurality of sacrificial layers, forming a mask layer on a surface of the substrate and on top and sidewall surfaces of the sidewall spacer. Further, the method includes performing a second patterning process on the mask layer using the first mask pattern as a mask to form a plurality of discretely arranged mask structures, where position and size of the plurality of mask structures correspond to position and size of the plurality of first target patterns.

Optionally, a mask structure covers at least one sidewall spacer; and at least one sidewall spacer is located between adjacent mask structures.

Optionally, forming the sidewall spacer includes: forming a sidewall spacer material film on the surface of the substrate and on top and sidewall surfaces of the sacrificial layer; and back-etching the sidewall spacer material film until the surface of the substrate and the top surface of the sacrificial layer are exposed, to form the sidewall spacer on the sidewall surface of the sacrificial layer.

Optionally, performing the first patterning process on the sacrificial film using the second mask pattern as a mask includes: forming a first photoresist on a surface of the sacrificial film; performing an exposure process on the first photoresist using the second mask pattern as a mask to form an initial first patterned layer; performing a development process on the initial first patterned layer to form a first patterned layer; and performing an etching process on the sacrificial film using the first patterned layer as a mask until the surface of the substrate is exposed to form the plurality of sacrificial layers.

Optionally, the sacrificial layer is made of a material including amorphous silicon, amorphous carbon, polysilicon, silicon oxide, silicon oxy-carbide, silicon oxy-carbo-nitride, or a combination thereof.

Optionally, performing the second patterning process on the mask layer using the first mask pattern as a mask includes: forming a second photoresist on the mask layer; performing an exposure process on the second photoresist using the first mask pattern as a mask to form an initial second patterned layer; performing a development process on the initial second patterned layer to form a second patterned layer; and etching the mask layer using the second patterned layer as a mask until the surface of the substrate is exposed to form the plurality of mask structures.

Optionally, the mask layer is made of a material different from the sidewall spacer; and the sidewall spacer is made of a material including silicon oxide, titanium dioxide, silicon nitride, silicon carbo-nitride, silicon boron-nitride, silicon oxy-carbo-nitride, silicon oxynitride, or a combination thereof.

Optionally, the mask layer is made of a material including photoresist or an organic material containing carbon and oxygen.

Optionally, a top surface of the mask layer is above or coplanar with a top surface of the sidewall spacer.

Optionally, the method further includes using a mask structure and the sidewall spacer as a mask, etching the substrate.

Another aspect of the present disclosure includes a semiconductor structure formed by any one of the disclosed methods.

The disclosed embodiments may have following beneficial effects. The present disclosure provides a mask pattern. The first mask pattern may be configured to perform a single exposure process and a single etching process to form a device with a substantially large critical dimension. The second mask pattern may be configured to perform a self-aligned multiple patterning process to form a device with a substantially small critical dimension. Because one first target pattern partially overlaps corresponding one second target pattern along the first direction, the space may be fully utilized. Therefore, while satisfying that the plurality of first target patterns in the first mask pattern have a desired pattern density, the plurality of second target patterns in the second mask pattern may also have desired pattern density.

Because the ratio of the size of the overlapped portion of the second target pattern with the first target pattern over the first size is in a range of approximately 40%-60%, and the ratio of the size the non-overlapped portion of the second target pattern with the first target pattern over the first distance is in a range of approximately 40%-60%, the second mask pattern may be subsequently used to perform a self-aligned multiple patterning process to form a sidewall spacer, and the first mask pattern may be configured to perform a single exposure process and a single etching process to form a mask structure. Therefore, a first portion of sidewall spacers may be located between adjacent mask structures, and a second portion of the sidewall spacers may overlap the mask structure. In other words, a projection of one of the second portion of the sidewall spacers on the substrate may be located within a projection of a corresponding mask structure on the substrate.

At the same time, the second mask pattern may have a desired pattern density, and the first mask pattern may have a desired pattern density. The second mask pattern may be configured to perform a first patterning process, the first mask pattern may be configured to perform a second patterning process, and, thus, the formed structure may have a desired pattern density. The sidewall spacer located between adjacent mask structures may be ultimately transferred to the substrate to form a device with a substantially small critical dimension and desired uniformity. The sidewall spacer overlapped with the mask structure may be ultimately transferred to the substrate using the mask structure as a mask, to form a device with a substantially large critical dimension and desired uniformity.

In the disclosed method for forming the semiconductor structure, because the first mask pattern has a desired pattern density, the second patterning process performed with the first mask pattern may have desired stability and may produce substantially few defects, such that the formed pattern may have desired uniformity. Because the second mask pattern has desired pattern density, the first patterning process performed with the second mask pattern may have desired stability and may produce substantially few defects, such that the formed pattern may have desired uniformity. Therefore, the formed semiconductor structure may have desired device performance.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
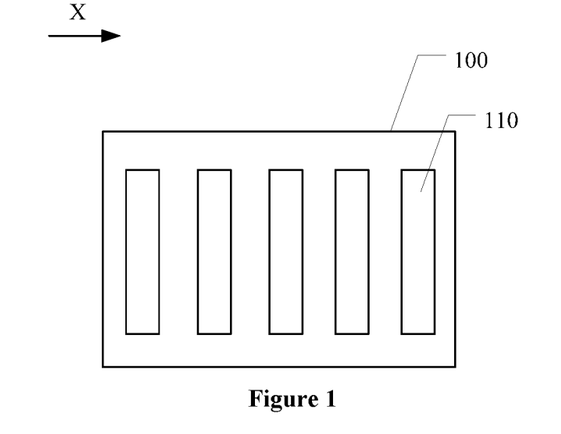
FIG. 1 illustrates a schematic structural diagram of a mask pattern.

FIG. 1 illustrates a schematic structural diagram of a mask pattern. Referring to FIG. 1, a mask pattern 100 includes a plurality of first target patterns 110, and the plurality of first target patterns 110 are arranged along a first direction X.

The mask pattern 100 is used to perform a single exposure process and a single etching process, to form a device with a substantially large feature dimension. To simultaneously form a device with a substantially small feature dimension, another mask pattern is designed on the basis of the mask pattern 100, which will be described in detail below in conjunction with the accompanying drawings.

Figure 2:
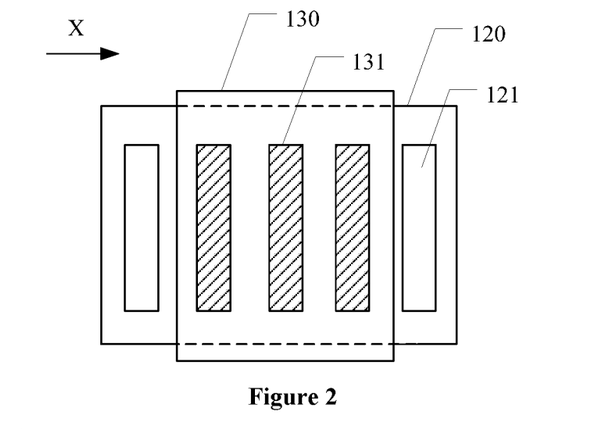
FIG. 2 illustrates a schematic structural diagram of another mask pattern.

FIG. 2 illustrates a schematic structural diagram of another mask pattern. Referring to FIG. 2, a mask pattern includes a first mask pattern 120 and a second mask pattern 130. The first mask pattern 120 includes a plurality of first target patterns 121, and the plurality of first target patterns 121 are arranged along the first direction X. The second mask pattern 130 includes a plurality of second target patterns 131, and the plurality of second target patterns 131 are arranged along the first direction X. The second target pattern 131 does not overlap the first target pattern 121.

The first mask pattern 120 is used to perform a single exposure process and a single etching process to form a device with a substantially large critical dimension. The second mask pattern 130 is used to perform a self-aligned multiple patterning process to form a device with a substantially small critical dimension. Therefore, process requirements for forming the device with two size types of critical dimensions are satisfied.

However, in comparison with FIG. 1 and FIG. 2, in the existing technology, to form a device with a substantially small critical dimension, a portion of positions for forming the first target patterns 121 is used to form the second target patterns 131. In other words, the second target pattern 131 occupies the position in the first mask pattern 120 that is originally used to form the first target pattern 121. Therefore, the first mask pattern 120 may have substantially poor pattern density and uniformity, and the second mask pattern 130 may have substantially poor density and uniformity. Thus, the stability of the etching process performed with the first mask pattern 120 is substantially poor, and the stability of the etching process performed with the second mask pattern 130 is substantially poor.

The present disclosure provides a mask pattern. The mask pattern may include a first mask pattern and a second mask pattern. The first mask pattern may include a plurality of first target patterns, and the plurality of first target patterns may be arranged along a first direction. The second mask pattern may include a plurality of second target patterns, and the plurality of second target patterns may be arranged along the first direction. In the first direction, one of the plurality of first target patterns may partially overlap corresponding one of the plurality of second target patterns. The mask pattern may have desired pattern density.

Figure 3:
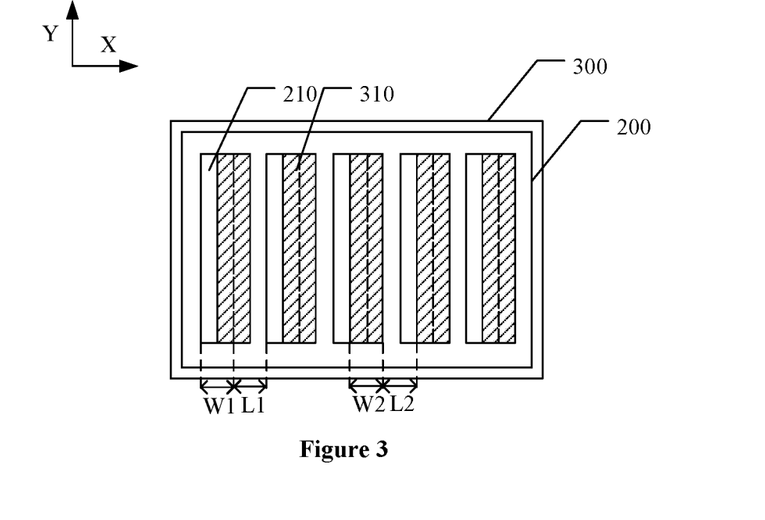
FIG. 3 illustrates a schematic structural diagram of a mask pattern consistent with various disclosed embodiments of the present disclosure.

FIG. 3 illustrates a schematic structural diagram of a mask pattern consistent with various disclosed embodiments of the present disclosure. Referring to FIG. 3, a mask pattern is provided. The mask pattern may include a first mask pattern 200 and a second mask patterns 300. The first mask pattern 200 may include a plurality of first target patterns 210, and the plurality of first target patterns 210 may be arranged along a first direction X. The second mask pattern 300 may include a plurality of second target patterns 310, and the plurality of second target patterns 310 may be arranged along the first direction X. When the first mask pattern 200 overlaps the second mask patterns 300, one first target pattern 210 may partially overlap corresponding one second target pattern 310.

The first mask pattern 200 may be configured to perform a single exposure process and a single etching process to form a device with a substantially large critical dimension. The second mask pattern 300 may be configured to perform a self-aligned multiple patterning process to form a device with a substantially small critical dimension. Because one first target pattern 210 partially overlaps corresponding one second target pattern 310 along the first direction X, the space may be fully utilized. Therefore, while satisfying that the plurality of first target patterns 210 in the first mask pattern 200 have a desired pattern density, the plurality of second target patterns 310 in the second mask pattern 300 may also have desired pattern density. The detailed description may be given below in conjunction with the drawings.

Along the first direction X, each first target pattern 210 may have a first size W1, and adjacent first target patterns 210 may have a first distance L1. Along the first direction X, each second target pattern 310 may have a second size W2, and adjacent second target patterns 310 may have a second distance L2.

Along the first direction X, a ratio of the size of the overlapped portion of the second target pattern 310 with the first target pattern 210 over the first size may be in a range of approximately 40%-60%, and a ratio of the size of the non-overlapped portion of the second target pattern 310 with the first target pattern 210 over the first distance may be in a range of approximately 40%-60%.

Because the ratio of the size of the overlapped portion of the second target pattern 310 with the first target pattern 210 over the first size W1 is in a range of approximately 40%-60%, and the ratio of the size of the non-overlapped portion of the second target pattern 310 with the first target pattern 210 over the first distance L1 is in a range of approximately 40%-60%, the second mask pattern 300 may be subsequently used to perform a self-aligned multiple patterning process to form a sidewall spacer, and the first mask pattern 200 may be configured to perform a single exposure process and a single etching process to form a mask structure. Therefore, a first portion of the sidewall spacers may be located between adjacent mask structures, and a second portion of the sidewall spacers may overlap the mask structure. In other words, a projection of one of the second portion of the sidewall spacers on the substrate may be located within a projection of a corresponding mask structure on the substrate.

At the same time, the second mask pattern 300 may have a desired pattern density, and the first mask pattern 200 may have a desired pattern density. The second mask pattern 300 may be configured to perform a first patterning process, the first mask pattern 200 may be configured to perform a second patterning process, and, thus, the formed structure may have a desired pattern density. The sidewall spacer located between adjacent mask structures may be ultimately transferred to the substrate to form a device with a substantially small critical dimension and desired uniformity. The sidewall spacer overlapped with the mask structure may be ultimately transferred to the substrate using the mask structure as a mask, to form a device with a substantially large critical dimension and desired uniformity.

Because the ratio of the size of the overlapped portion of the second target pattern 310 with the first target pattern 210 over the first size W1 is in a range of approximately 40%-60%, and the ratio of the size of the non-overlapped portion of the second target pattern 310 with the first target pattern 210 over the first distance L1 is in a range of approximately 40%-60%, the second mask pattern 300 may be subsequently used to perform a self-aligned multiple patterning process to form the sidewall spacer. Therefore, a first portion of the sidewall spacers may be located within the first distance L1, and a second portion of the sidewall spacers may overlap the first target pattern 210. In other words, one of the second portion of the sidewall spacers may be located within a corresponding first target pattern 210.

At the same time, the second mask pattern 300 may have a desired pattern density, and the first mask pattern 200 may have a desired pattern density. After the portion of the sidewall spacer overlaps the first target pattern 210 in the first mask pattern 200, the formed structure may have desired pattern density. The sidewall spacer located within the first distance L1 may be ultimately transferred to the substrate to form a device with a substantially small critical dimension and desired uniformity. The sidewall spacer overlapped with the first target pattern 210 may be ultimately transferred to the substrate using the first target pattern 210 as a mask, to form a device with a substantially large critical dimension and desired uniformity.

In one embodiment, along the first direction X, the size of the overlapped portion of the second target pattern 310 with the first target pattern 210 may be approximately ½ of the first size W1, and the size of the non-overlapped portion of the second target pattern 310 with the first target pattern 210 may be approximately ½ of the first distance L1.

In one embodiment, along the first direction X, the second size W2 may be in a range of approximately 100 nm-200 nm; and the first size W1 may be in a range of approximately 100 nm-200 nm. In another embodiment, along the first direction, the second size may be in a range of approximately 45 nm-60 nm; and the first size may be in a range of approximately 25 nm-45 nm.

The first mask pattern 200 may further include a plurality of first main target patterns (not illustrated), and the plurality of first main target patterns may be arranged along the first direction X. The second mask pattern 300 may further include a plurality of second main target patterns (not illustrated), and the plurality of second main target patterns may be arranged along the first direction.

The first mask pattern may be configured to perform the photolithography process, and the device formed by the first main target pattern may have electrical functions, while the device formed by the first target pattern may not have electrical functions. The first target pattern may be configured to improve the pattern density of the first mask pattern.

Similarly, the second mask pattern may be configured to perform the photolithography process, and the device formed by the second main target pattern may have electrical functions, while the device formed by the second target pattern may not have electrical functions. The second target pattern may be configured to improve the pattern density of the second mask pattern.

Figure 11:
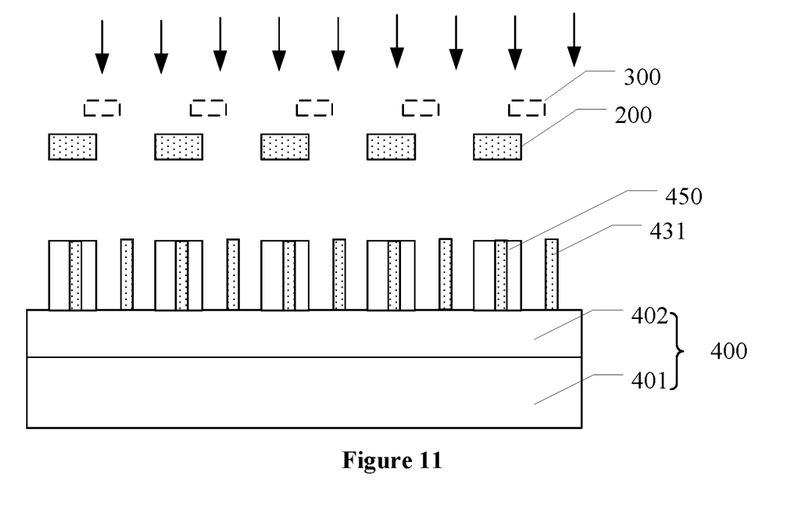
Figure 12:
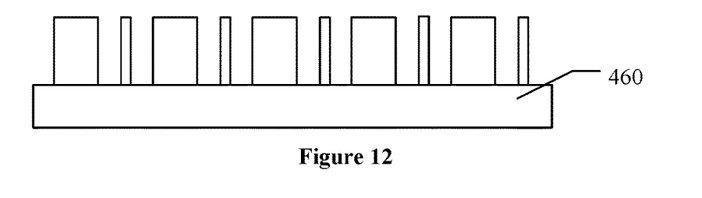
Figure 13:
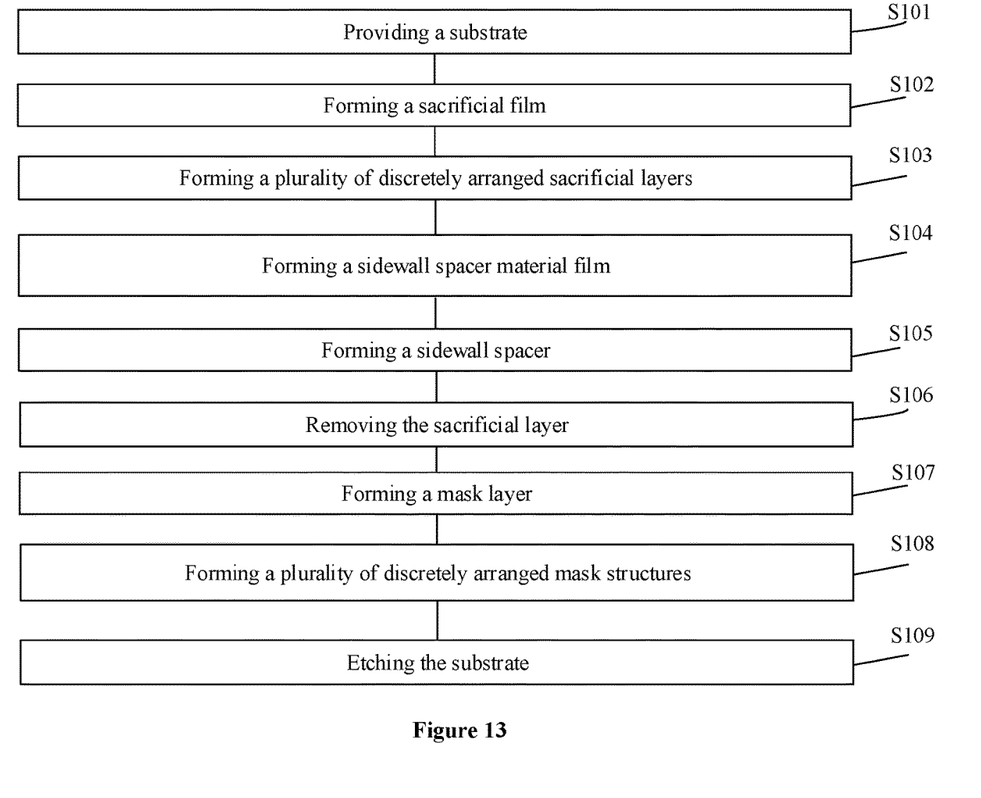
FIG. 13 illustrates a flowchart of an exemplary method for forming a semiconductor structure consistent with various disclosed embodiments of the present disclosure.

Correspondingly, the present disclosure also provides a method for forming a semiconductor structure. FIG. 13 illustrates a flowchart of a method for forming the semiconductor structure consistent with various disclosed embodiments of the present disclosure, and FIGS. 4-12 illustrate semiconductor structures corresponding to certain stages of the fabrication method.

Figure 4:
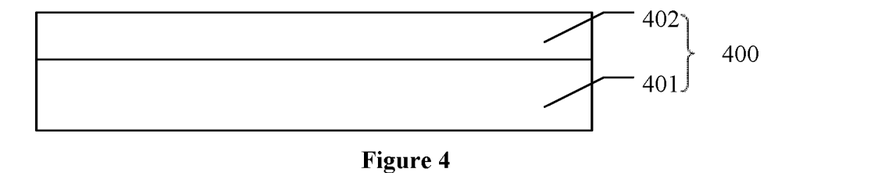
FIGS. 4-12 illustrate semiconductor structures corresponding to certain stages for forming an exemplary semiconductor structure consistent with various disclosed embodiments of the present disclosure.

As shown in FIG. 13, at the beginning of the fabrication method, a substrate may be provided (S101). FIG. 4 illustrates a corresponding semiconductor structure.

Referring to FIG. 4, a substrate 400 may be provided. In one embodiment, the substrate 400 may include a base 401 and a hard mask layer 402 on the base 401.

In one embodiment, the base 401 may be made of silicon. In another embodiment, the base may be made of germanium, silicon germanium, silicon carbide, gallium arsenide, or indium gallium. The hard mask layer 402 may be made of a material including silicon oxide, silicon nitride, titanium nitride, silicon oxy-carbo-nitride, or silicon oxynitride. In one embodiment, the hard mask layer 402 may have a single-layer structure, and the hard mask layer 402 may be made of silicon oxide.

Figure 5:
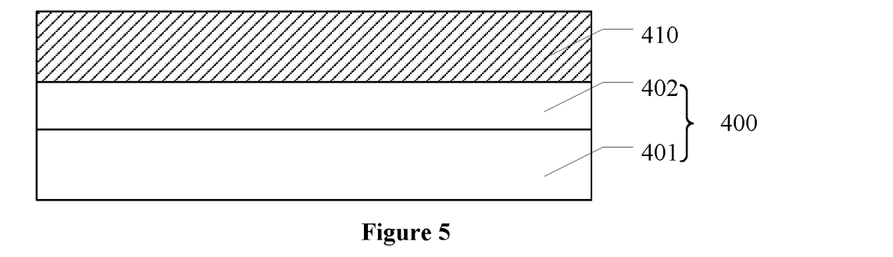

Returning to FIG. 13, after providing the substrate, a sacrificial film may be formed (S102). FIG. 5 illustrates a corresponding semiconductor structure.

Referring to FIG. 5, a sacrificial film 410 may be formed on the substrate 400. The sacrificial film 410 may be configured to provide material for subsequently forming a sacrificial layer.

In one embodiment, the sacrificial film 410 may be formed on the hard mask layer 402. The sacrificial film 410 may be made of a material including amorphous silicon, amorphous carbon, polysilicon, silicon oxide, silicon oxy-carbide, or silicon oxy-carbo-nitride.

Figure 6:
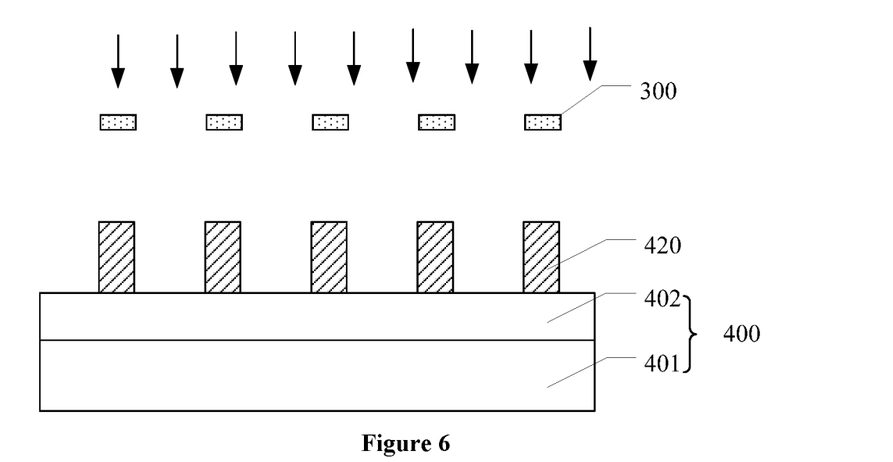

Returning to FIG. 13, after forming the sacrificial film, a plurality of discretely arranged sacrificial layers may be formed (S103). FIG. 6 illustrates a corresponding semiconductor structure.

Referring to FIG. 6, any one of the above-disclosed mask patterns may be provided. The second mask pattern 300 may be configured to perform a first patterning process on the sacrificial film 410 to form a plurality of discretely arranged sacrificial layers 420. The position and size of the plurality of sacrificial layers 420 may correspond to the position and size of the plurality of second target patterns 310. The sacrificial layer 420 may be configured to provide support for subsequently performing the self-aligned multiple patterning process to form a sidewall spacer.

Because the second mask pattern 300 has desired pattern density, the first patterning process performed with the second mask pattern 300 may have desired stability and may produce substantially few defects, such that the formed pattern may have desired uniformity. In other words, the formed sacrificial layers 420 may have desired size uniformity, and thus the sidewall spacers subsequently formed on the sidewalls of the sacrificial layers 420 may have desired size uniformity.

Performing the first patterning process on the sacrificial film 410 with the second mask pattern 300 may include: forming a first photoresist (not illustrated) on the surface of the sacrificial film 410; performing an exposure process on the first photoresist with the second mask pattern to form an initial first patterned layer (not illustrated); performing a development process on the initial first patterned layer to form a first patterned layer; and performing an etching process on the sacrificial film 410 using the first patterned layer as a mask until the surface of the substrate 400 is exposed to form the sacrificial layer 420.

In one embodiment, after forming the sacrificial layer 420, the method may further include removing the first patterned layer. Then, a sidewall spacer may be formed on a sidewall surface of the sacrificial layer.

Figure 7:
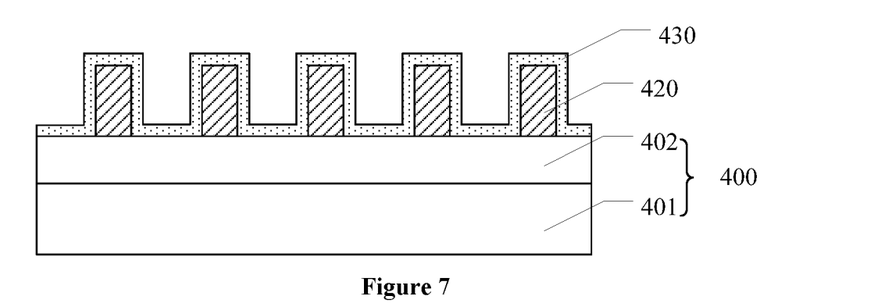

Returning to FIG. 13, after forming the plurality of sacrificial layers, a sidewall spacer material film may be formed (S104). FIG. 7 illustrates a corresponding semiconductor structure.

Referring to FIG. 7, a sidewall spacer material film 430 may be formed on the surface of the substrate 400 and on the top and sidewall surfaces of the sacrificial layer 420. The sidewall spacer material film 430 may be configured to subsequently form a sidewall spacer.

The sidewall spacer material film 430 may be made of a material including silicon oxide, titanium dioxide, silicon nitride, silicon carbo-nitride, silicon boron-nitride, silicon oxy-carbo-nitride, or silicon oxynitride. In one embodiment, the sidewall spacer material film 430 may be made of titanium dioxide.

Forming the sidewall spacer material film 430 may include a chemical vapor deposition process, a physical vapor deposition process, an atomic layer deposition process, or a combination thereof.

Figure 8:
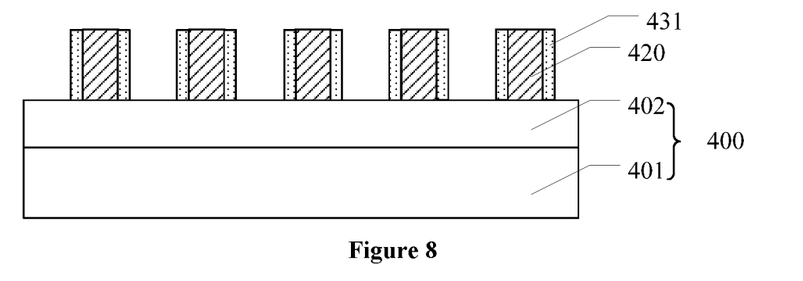

Returning to FIG. 13, after forming the sidewall spacer material film, a sidewall spacer may be removed (S105). FIG. 8 illustrates a corresponding semiconductor structure.

Referring to FIG. 8, the sidewall spacer material film 430 may be back-etched until the surface of the substrate 400 and the top surface of the sacrificial layer 420 are exposed, to form a sidewall spacer 431 on the sidewall surface of the sacrificial layer 420.

A thickness of the sidewall spacer 431 may determine the size of ultimately formed substantially small critical dimension. It should be noted that the thickness of the sidewall spacer 431 may also need to be smaller than a distance between adjacent first target pattern and second target pattern.

Because the sidewall spacer 431 is formed by back-etching the sidewall spacer material film 430, correspondingly, the sidewall spacer 431 may be made of a material including silicon oxide, titanium dioxide, silicon nitride, silicon carbo-nitride, silicon boron-nitride, silicon oxy-carbo-nitride, or silicon oxynitride. In one embodiment, the sidewall spacer 431 may be made of titanium dioxide.

Figure 9:
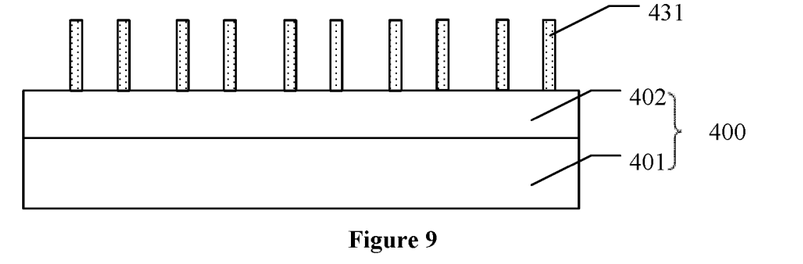

Returning to FIG. 13, after forming the sidewall spacer, the sacrificial layer may be removed (S106). FIG. 9 illustrates a corresponding semiconductor structure.

Referring to FIG. 9, after forming the sidewall spacer 431, the sacrificial layer 420 may be removed. Removing the sacrificial layer 420 may include one or more of a dry etching process and a wet etching process. In one embodiment, removing the sacrificial layer 420 may include an anisotropic dry etching process.

Figure 10:
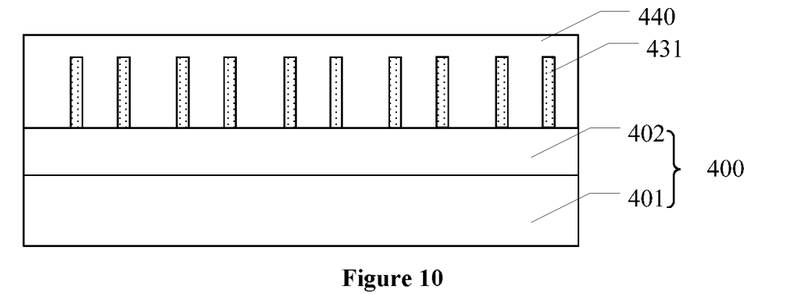

Returning to FIG. 13, after removing the sacrificial layer, a mask layer may be formed (S107). FIG. 10 illustrates a corresponding semiconductor structure.

Referring to FIG. 10, after removing the sacrificial layer 420, a mask layer 440 may be formed on the surface of the substrate 400 and on the top and sidewall surfaces of the sidewall spacer 431.

A top surface of the mask layer 440 may be above or coplanar with a top surface of the sidewall spacer 431. The mask layer 440 may provide a flat surface for subsequently performing a second patterning process. In one embodiment, the top surface of the mask layer 440 may be above the top surface of the sidewall spacer 431.

The mask layer 440 may be made of a material different from the sidewall spacer 431. The mask layer 440 may be made of a material including photoresist or an organic material containing carbon and oxygen. In one embodiment, the mask layer 440 may be made of an organic material containing carbon and oxygen, and the mask layer 440 may be formed by a spin coating process.

Returning to FIG. 13, after forming the mask layer, a plurality of discretely arranged mask structures may be formed (S108). FIG. 11 illustrates a corresponding semiconductor structure.

Referring to FIG. 11, a second patterning process may be performed on the mask layer 440 with the first mask pattern 200 to form a plurality of discretely arranged mask structures 450. The position and size of the plurality of mask structures 450 may correspond to the position and size of the plurality of first target patterns 210.

In the first mask pattern 200, each of the plurality of first target patterns 210 may have the first size W1, and adjacent first target patterns 210 may have a first distance L1. Therefore, the formed mask structure 450 may have the first size W1, and adjacent mask structures 450 may have a first distance L1.

The mask structure 450 may cover at least one sidewall spacer 431; and at least one sidewall spacer 431 may be located between adjacent mask structures 450. In one embodiment, the mask structure 450 may cover one sidewall spacer 431, and one sidewall spacer 431 may be located between adjacent mask structures 450.

The method of using the first mask pattern 200 to perform the second patterning process on the mask layer 440 may include: forming a second photoresist (not illustrated) on the mask layer 440; performing an exposure process on the second photoresist with the first mask pattern 200 to form an initial second patterned layer (not illustrated); performing a development process on the initial second patterned layer to form a second patterned layer (not illustrated); and using the second patterned layer as a mask, etching the mask layer 440 until the surface of the substrate 400 is exposed to form the mask structure 450.

In one embodiment, the top surface of the mask structure 450 may be coplanar with the top surface of the sidewall spacer 431. In another embodiment, the mask structure may cover the top and sidewall surfaces of the sidewall spacer.

The second patterning process may be performed on the mask layer 440 with the first mask pattern 200, and the pattern in the first mask pattern 200 may be transferred to the mask layer 440 to form the mask structure 450. The mask structure 450 and the sidewall spacer 431 may together serve as a mask for subsequently etching the substrate 400.

Because the first mask pattern 200 has a desired pattern density, the second patterning process performed with the first mask pattern 200 may have desired stability and may produce substantially few defects, such that the formed pattern may have desired uniformity. In other words, the formed mask structures 450 may have desired size uniformity. Further, the sidewall spacers 431 may have desired size uniformity. Therefore, when performing the second patterning process, the stability of pattern transfer may be improved.

Returning to FIG. 13, after forming the plurality of mask structures, the substrate may be etched (S109). FIG. 12 illustrates a corresponding semiconductor structure.

Referring to FIG. 12, using the mask structure 450 and the sidewall spacer 431 as a mask, the substrate 400 may be etched. In one embodiment, using the mask structure 450 and the sidewall spacer 431 as a mask, the hard mask layer 402 and a portion of the base 401 located under the hard mask layer 402 may be etched to achieve the pattern transfer, and to form a semiconductor structure 460. The semiconductor structure 460 may include a first structure (not illustrated) formed by performing a pattern transfer using the sidewall spacer 431 as a mask, and a second structure (not illustrated) formed by performing a pattern transfer using the mask structure 450 as a mask. The first structure may have a substantially small critical dimension, and the second structure may have a substantially large critical dimension. Therefore, the formed semiconductor structure may include a device with two size types of critical dimensions.

Because the ratio of the size of the overlapped portion of the second target pattern 310 with the first target pattern 210 over the first size W1 is in a range of approximately 40%-60%, and the ratio of the size of the non-overlapped portion of the second target pattern 310 with the first target pattern 210 over the first distance L1 is in a range of approximately 40%-60%, the second mask pattern 300 may be configured to perform a self-aligned multiple patterning process to form the sidewall spacers 431, and the first mask pattern 200 may be configured to perform a single exposure process and a single etching process to form the mask structures 450. Therefore, a first portion of the sidewall spacers 431 may be located between adjacent mask structures 450, and a second portion of the sidewall spacers 431 may overlap the mask structure 450. In other words, a projection of one of the second portion of the sidewall spacers 431 on the substrate 400 may be located within a projection of a corresponding mask structure 450 on the substrate 400.

At the same time, the second mask pattern 300 may have a desired pattern density, and the first mask pattern 200 may have a desired pattern density. The second mask pattern 300 may be configured to perform the first patterning process, the first mask pattern 200 may be configured to perform the second patterning process, and, thus, the formed structure may have desired pattern density. The sidewall spacer 431 located between adjacent mask structures 450 may be ultimately transferred to the substrate 400 to form a device with a substantially small critical dimension and desired uniformity. The sidewall spacer 431 overlapped with the mask structure 450 may be ultimately transferred to the substrate 400 using the mask structure 450 as a mask, to form a device with a substantially large critical dimension and desired uniformity.

Correspondingly, the present disclosure also provides a semiconductor structure formed by any one of the above-disclosed methods.

The disclosed embodiments may have following beneficial effects. The present disclosure provides a mask pattern. The first mask pattern may be configured to perform a single exposure process and a single etching process to form a device with a substantially large critical dimension. The second mask pattern may be configured to perform a self-aligned multiple patterning process to form a device with a substantially small critical dimension. Because one first target pattern partially overlaps corresponding one second target pattern along the first direction, the space may be fully utilized. Therefore, while satisfying that the plurality of first target patterns in the first mask pattern have a desired pattern density, the plurality of second target patterns in the second mask pattern may also have desired pattern density.

Because the ratio of the size of the overlapped portion of the second target pattern with the first target pattern over the first size is in a range of approximately 40%-60%, and the ratio of the size of the non-overlapped portion of the second target pattern with the first target pattern over the first distance is in a range of approximately 40%-60%, the second mask pattern may be subsequently used to perform a self-aligned multiple patterning process to form a sidewall spacer, and the first mask pattern may be configured to perform a single exposure process and a single etching process to form a mask structure. Therefore, a first portion of sidewall spacers may be located between adjacent mask structures, and a second portion of the sidewall spacers may overlap the mask structure. In other words, a projection of one of the second portion of the sidewall spacers on the substrate may be located within a projection of a corresponding mask structure on the substrate.

At the same time, the second mask pattern may have a desired pattern density, and the first mask pattern may have a desired pattern density. The second mask pattern may be configured to perform a first patterning process, the first mask pattern may be configured to perform a second patterning process, and, thus, the formed structure may have a desired pattern density. The sidewall spacer located between adjacent mask structures may be ultimately transferred to the substrate to form a device with a substantially small critical dimension and desired uniformity. The sidewall spacer overlapped with the mask structure may be ultimately transferred to the substrate using the mask structure as a mask, to form a device with a substantially large critical dimension and desired uniformity.

In the disclosed method for forming the semiconductor structure, because the first mask pattern has a desired pattern density, the second patterning process performed with the first mask pattern may have desired stability and may produce substantially few defects, such that the formed pattern may have desired uniformity. Because the second mask pattern has desired pattern density, the first patterning process performed with the second mask pattern may have desired stability and may produce substantially few defects, such that the formed pattern may have desired uniformity. Therefore, the formed semiconductor structure may have desired device performance.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for forming a semiconductor structure, comprising:
   providing a substrate;
   forming a sacrificial film on the substrate;
   providing a mask pattern, including:
      a first mask pattern, wherein the first mask pattern includes a plurality of first target patterns, and the plurality of first target patterns are arranged along a first direction,
      a second mask pattern, wherein the second mask pattern includes a plurality of second target patterns, and the plurality of second target patterns are arranged along the first direction, wherein:
         when the first mask pattern overlaps the second mask pattern, one of the plurality of first target patterns partially overlaps a corresponding one of the plurality of second target patterns;
   performing a first patterning process on the sacrificial film using the second mask pattern as a mask to form a plurality of discretely arranged sacrificial layers, wherein position and size of the plurality of sacrificial layers correspond to position and size of the plurality of second target patterns;

forming sidewall spacers on a sidewall surface of a sacrificial layer of the plurality of sacrificial layers;

after forming the sidewall spacers, removing the plurality of sacrificial layers;

after removing the plurality of sacrificial layers, forming a mask layer on a surface of the substrate and on top and sidewall surfaces of the sidewall spacers; and performing a second patterning process on the mask layer using the first mask pattern as a mask to form a plurality of discretely arranged mask structures, wherein position and size of the plurality of mask structures correspond to position and size of the plurality of first target patterns, and the first mask pattern covers the sidewall spacers alternately along the first direction.

2. The method according to claim 1, wherein:

the plurality of mask structures have top surfaces coplanar with top surfaces of the sidewall spacers;

a mask structure covers at least one sidewall spacer; and at least one sidewall spacer is located between adjacent mask structures.

3. The method according to claim 1, wherein forming the sidewall spacers includes:

forming a sidewall spacer material film on the surface of the substrate and on top and sidewall surfaces of the sacrificial layer; and back-etching the sidewall spacer material film until the surface of the substrate and the top surface of the sacrificial layer are exposed, to form the sidewall spacers on the sidewall surface of the sacrificial layer.

4. The method according to claim 1, wherein performing the first patterning process on the sacrificial film using the second mask pattern as a mask includes:

forming a first photoresist on a surface of the sacrificial film;

performing an exposure process on the first photoresist using the second mask pattern as a mask to form an initial first patterned layer;

performing a development process on the initial first patterned layer to form a first patterned layer; and performing an etching process on the sacrificial film using the first patterned layer as a mask until the surface of the substrate is exposed to form the plurality of sacrificial layers.

5. The method according to claim 1, wherein:

the sacrificial layer is made of a material including amorphous silicon, amorphous carbon, polysilicon, silicon oxide, silicon oxy-carbide, silicon oxy-carbonitride, or a combination thereof.

6. The method according to claim 1, wherein performing the second patterning process on the mask layer using the first mask pattern as a mask includes:

forming a second photoresist on the mask layer;

performing an exposure process on the second photoresist using the first mask pattern as a mask to form an initial second patterned layer;

performing a development process on the initial second patterned layer to form a second patterned layer; and etching the mask layer using the second patterned layer as a mask until the surface of the substrate is exposed to form the plurality of mask structures.

7. The method according to claim 1, wherein:

the mask layer is made of a material different from the sidewall spacers; and the sidewall spacers are made of a material including silicon oxide, titanium dioxide, silicon nitride, silicon carbo-nitride, silicon boron-nitride, silicon oxy-carbonitride, silicon oxynitride, or a combination thereof.

8. The method according to claim 1, wherein:

the mask layer is made of a material including photoresist or an organic material containing carbon and oxygen.

9. The method according to claim 1, wherein:

a top surface of the mask layer is above or coplanar with a top surface of the sidewall spacers.

10. The method according to claim 1, further including:

using a mask structure and the sidewall spacers as a mask, etching the substrate.

\* \* \* \* \*